United States Patent
Ohto

(10) Patent No.: US 6,335,277 B2
(45) Date of Patent: *Jan. 1, 2002

(54) METHOD FOR FORMING METAL NITRIDE FILM

(75) Inventor: Koichi Ohto, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/318,807

(22) Filed: May 26, 1999

(30) Foreign Application Priority Data

May 27, 1998 (JP) .......................... 10-145632

(51) Int. Cl.$^7$ .............................................. H01L 21/44
(52) U.S. Cl. ....................................... 438/660; 438/656
(58) Field of Search ................................ 438/652, 656, 438/660, 663, 668

(56) References Cited

U.S. PATENT DOCUMENTS

| | | | | |
|---|---|---|---|---|
| 5,119,153 A | * | 6/1992 | Korman et al. | 257/341 |
| 5,232,871 A | * | 8/1993 | Ho | 438/653 |
| 5,393,565 A | * | 2/1995 | Suzuki et al. | 427/255.2 |
| 5,534,463 A | * | 7/1996 | Lee et al. | 438/643 |
| 5,591,672 A | * | 1/1997 | Lee et al. | 438/533 |
| 5,601,869 A | * | 2/1997 | Scott et al. | 427/126.3 |
| 5,723,382 A | * | 3/1998 | Sandhu et al. | 438/653 |
| 6,013,566 A | * | 1/2000 | Thakur et al. | 438/513 |

FOREIGN PATENT DOCUMENTS

| | | |
|---|---|---|
| JP | 5-343336 | 12/1993 |
| JP | 6-510089 | 11/1994 |

OTHER PUBLICATIONS

C. Wang et al., "Enhanced MOCVD Titanium Nitride Film (TiN:C) for Barrier Metal Application in Sub–half Micron Technology", 1995 Dry Process Symposium, (1995), pp. 129–133.

J.T. Hillman et al., "Properties of LPCVD TiN Barrier Layers", Microelectronic Engineering 19, (1992), pp. 375–378 with Abstract.

* cited by examiner

*Primary Examiner*—Carl Whitehead, Jr.
*Assistant Examiner*—Jeff Vockrodt
(74) *Attorney, Agent, or Firm*—Sughrue Mion, PLLC

(57) ABSTRACT

A method for forming a titanium nitride film of an excellent quality on a semiconductor substrate at a low temperature is achieved. With a heated semiconductor substrate on a susceptor held at a temperature of about 500° C., titanium tetrachloride and ammonia are introduced into a reactor to carry out the deposition of the titanium nitride film. After the deposition is completed, the semiconductor substrate within the reactor is continuously held at a temperature of 500° C. After a low pressure mercury lamp is turned on, while the inner part of the reactor is irradiated with ultraviolet rays with a wavelength of 170–280 nm emitted from the lamp, an ammonia gas is introduced, with the flow rate adjusted to about 1000 sccm, into the reactor held at a pressure of about 10 Torr to carry out annealing in an ammonia atmosphere for about 60 seconds.

10 Claims, 2 Drawing Sheets

METHOD FOR FORMING METAL NITRIDE FILM

BACKGROUND OF THE INVENTION

1. Field of the Invention

The present invention relates in general to a method for forming a metal nitride film and more particularly to a method for growing metal nitride films such as titaniumnitride (TiN), tungsten nitride (WN) or tantalum nitride (TaN) films suitably used as an electronic conductor film in a semiconductor device and the like.

2. Description of the Related Art

A metal nitride film, a titanium nitride film in particular, is conventionally and widely employed as a contact layer or a diffused barrier layer for an underlying layer on which aluminum wiring, contacts and the like are provided.

As a method for the deposition of such a titanium nitride, a reactive sputtering is widely used wherein titanium is sputtered on a substrate in a nitrogen atmosphere.

However, in order to meet the needs of downsizing and high integration of semiconductor circuits, an increase in an aspect ratio representing a ratio of width to depth of a trench for a contact hole or buried wiring provided on an interlayer dielectric is now required. Since conventional reactive sputtering cannot provide titanium nitride film showing excellent step coverage, the demand for the deposition of the titanium nitride film into a fine contact hole or trench with a high aspect ratio has not yet been met.

A variety of methods of CVD (chemical vapor deposition), instead of a reactive sputtering, are currently utilized as a means to meet the need of providing a fine contact hole or trench for high aspect ratio wiring.

One method of CVD is thermal CVD, wherein titanium tetrachloride ($TiCl_4$) and ammonia ($NH_3$) are heated to a high temperature so that a titanium nitride film is grown on a substrate ("Properties of LPCVD TiN Barrier Layers", J.T. Hillman, D. W. Studiner, M. J. Rice. and C. Arena, Microelectronic Engineering 19 (1992) PP. 375–378) and another is MOCVD (Metal Organic Chemical Vapor Deposition) wherein tetrakis-dimethylamino-titanium [$Ti(N(CH_3)_2)4$] is thermally decomposed so that carbon-containing titanium nitride (TiN:C) film is grown on a substrate ("Enhanced MOCVD Titanium Nitride Film for Barrier Metal Application in Sub-half Micron Technology", Chin-Kun Wang, Lu-Min Liu, Marvin Liao, Huang-Chung Cheng, and Mou-Shiung Lin. 1995 DRY PROCESS SYMPOSIUM (1995) PP. 129–133).

Others methods include plasma CVD or photo CVD methods for forming a titanium nitride film. In these methods, because a reaction tends to occur easily in the vapor phase; and plasma or light has directivity. Therefore, it is difficult to have a good step coverage. These methods are not suited to forming a titanium nitride film used as a contact layer or a barrier metal layer.

Since the conventional thermal CVD uses titanium tetrachloride ($TiCl_4$) in the process, there is a problem in that chlorine residue remains in the titanium nitride film. In the conventional method, a temperature exceeding 600° C. is required to reduce a residual amount of chlorine in the film.

However, because aluminum is melted at a deposition temperature exceeding 550° C., such a high temperature CVD is not applicable once the formation of aluminum wiring has been completed.

To further reduce the concentration of residual chlorine in a film, ammonia thermal annealing is generally carried out in the same reactor continuously, following the formation of a titanium nitride film (Japanese Laid-Open Application No. Hei 6-510089). If, however, a temperature for annealing is decreased so as to apply the high temperature CVD method even after the completion of aluminum wiring, it causes an insufficient elimination of chlorine and an unsatisfactory nitridation of the film. Particularly, if the temperature for annealing is less than 550° C., the film nitridation is not enough, and when the film is exposed to air, oxygen or water is adsorbed to a site where the bonding of chlorine is broken, causing the oxidation of the titanium nitride film, thus rendering the film useless.

On the other hand, the conventional MOCVD method allows the deposition at a relatively low temperature of about 400° C. and is applicable even after the formation of aluminum wiring. However, this method also has disadvantages in that, because it uses tetrakis-dimethylamino-titanium [$Ti(N(CH_3)_2)4$] as a processing material, a lot of carbon resides in the titanium nitride film. Due to a high specific resistance of a film, when exposed to air, oxidation occurs easily and the quality of the film is made unusable due to secular change.

The best way to resolve this problem seems to be to carry out the deposition and nitridation using a nitrogen gas plasma little by little. However, if a carbon-containing titanium nitride (TiN:C) film is used as a barrier metal for contact, there is a risk that an underlying transistor is broken due to the collision of the nitrogen gas plasma.

SUMMARY OF THE INVENTION

In view of the above, it is an object of the present invention to provide a method for forming a metal nitride film having a low specific resistance as well as an excellent quality, even if it is obtained by the CVD processes carried out at a low temperature, and a method of being able to be applied even after the formation of aluminum wiring.

According to a first aspect of the present invention, there is provided a method of forming a metal nitride film comprising the steps of growing a metal nitride film on the substrate, and carrying out a heat treatment of the metal nitride film, while it is exposed to light, in an atmosphere of gas including a compound or group represented by a chemical formula of $N_mH_n$ (N is a nitrogen atom, H being a hydrogen atom and, m and n being any natural number).

According to a second aspect of the present invention, there is provided a method of forming a metal nitride film, wherein the above compound or group represented by the chemical formula of $N_mH_n$ comprises at least one member selected from the group consisting of $NH_3$ and NH, $NH_2$, $NH_4$, and $N_2H_3$ and $N_2H_4$.

A preferable mode is one that wherein comprises a step of repeating, alternately and a predetermined number of times, a process of growing the metal nitride film on the substrate and a process of thermally treating the metal nitride film while it is exposed to light in the gas atmosphere.

Also, a preferable mode is one that wherein comprises a step of carrying out, in the same reactor, a process of growing the metal nitride film on the substrate and a process of thermally treating the metal nitride film while it is exposed to light in the gas atmosphere.

Also, a preferable mode is one wherein the above metal nitride film formed on the substrate comprises at least one member selected from the group consisting of titanium nitride, carbon-containing titanium nitride, oxygen-containing titanium nitride, tantalum nitride and tungsten nitride.

Also, a preferable mode is one that wherein comprises a step of growing the metal nitride film on the substrate by using CVD (Chemical Vapor Deposition).

Moreover, a preferable mode is one wherein the above light is ultraviolet.

BRIEF DESCRIPTION OF THE DRAWING

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
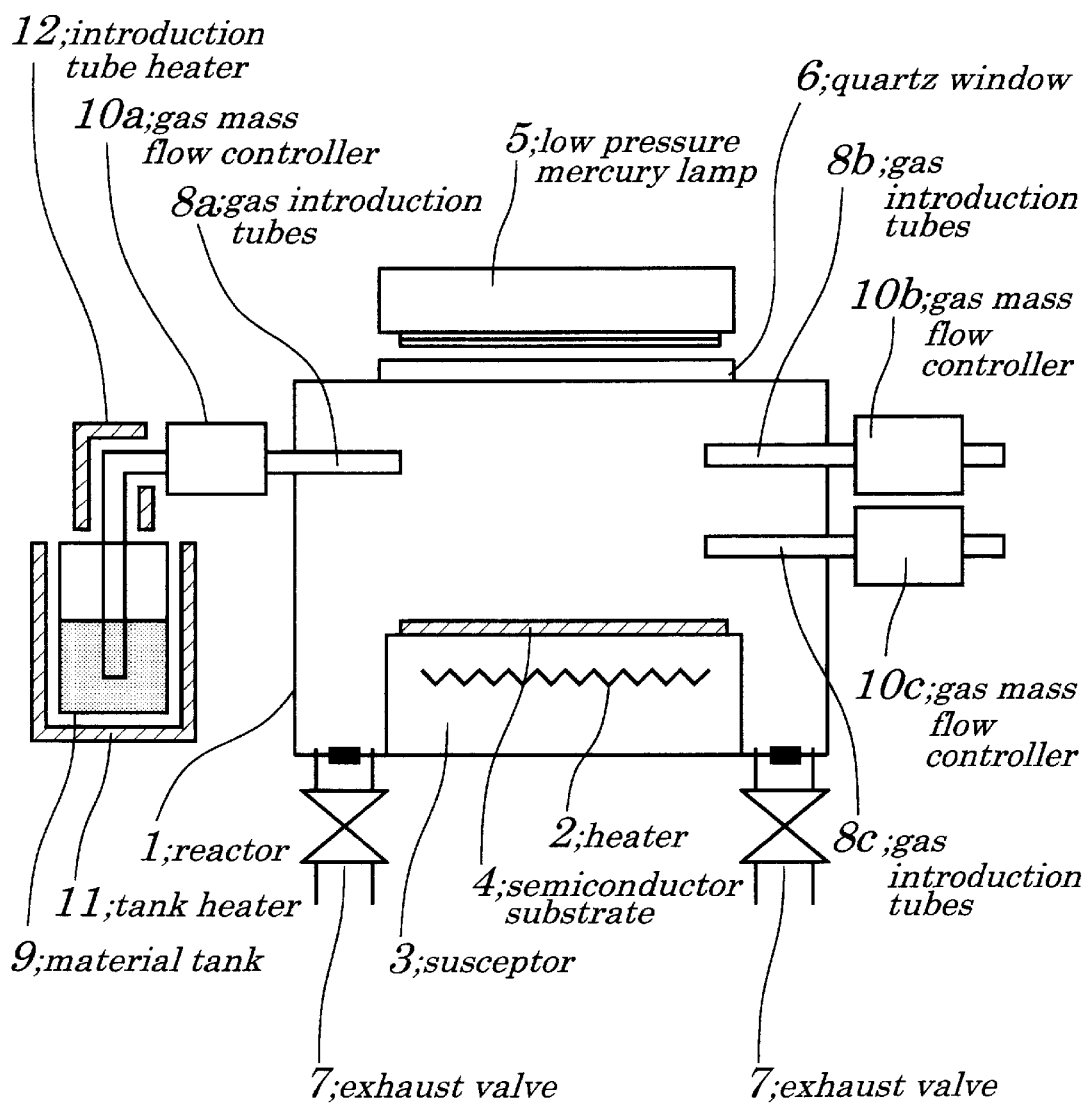
FIG. 1 is a schematic cross section of a reactor to implement a method for forming a titanium nitride film in accordance with the first embodiment of the present invention.

FIG. 1 is a schematic cross section of a CVD reactor to implement a method for growing a titanium nitride film in accordance with a first preferred embodiment of the present invention.

In the first embodiment, after a titanium nitride film is grown on a semiconductor substrate using a LPCVD (Low Pressure Chemical Vapor Deposition) method, while a reactor 1 is irradiated with ultraviolet rays using a low pressure mercury lamp 5, the titanium nitride film is annealed in an ammonia gas atmosphere by employing a CVD reactor as shown below. The CVD reactor employed in the first embodiment is a hot-wall type low-pressure CVD reactor which is so constructed that, in the reactor 1 (deposition chamber) as depicted in FIG. 1, a semiconductor substrate 4 composed of a silicon wafer and the like can be heated, through a susceptor (substrate holder) 3, by a heater 2 for heating a substrate using a radio frequency wave, infrared ray lamp, or resistor. The low-pressure mercury lamp 5 for emitting ultraviolet rays is attached to the reactor externally. The low-pressure mercury lamp 5 is so disposed that the inner part of the reactor 1 can be irradiated with ultraviolet rays through a quartz window 6 attached on the surface of the reactor 1.

The inner part of the reactor 1 is held under a reduced pressure by evacuating air from a turbo-molecular pump and dry pump (not shown) through an exhaust valve 7. On the other hand, a reactive gas, titanium tetrachloride ($TiCl_4$) as a reactive gas and ammonia ($NH_3$) as another reactive gas are introduced into the reactor 1 through gas introduction tubes 8a and 8b respectively. Further, a nitrogen gas used as a diluent gas is also introduced through a gas introduction tube 8c into the reactor 1.

The titanium tetrachloride is stored in a liquid state within a material tank 9 and, when receiving heat of vaporization from a tank heater 11, it changes into a titanium tetrachloride gas. The titanium tetrachloride gas, after being heated to a predetermined temperature by an introduction tube heater 12, as shown in FIG. 1, is introduced, with its flow rate adjusted by a gas mass flow controller 10a, into the reactor 1 through the gas introduction tube 8a as well.

Moreover, though not shown in the drawing, an ammonia gas, produced by nitridation of the titanium tetrachloride, and a nitrogen gas used as a diluent gas are stored in an exclusive tank (not shown). The ammonia gas outputted from the exclusive tank is also introduced, with its flow rate adjusted by a gas mass flow controller 10b, into the reactor 1 through the gas introduction tube 8b. The nitrogen gas, after being exhausted from the exclusive tank, is introduced, with its flow rate adjusted by the gas mass flow controller 10c, into the reactor 1, through the gas introduction tube 8c.

By referring to FIG. 1, the method for growing a titanium nitride film in the first embodiment of the present invention is described hereinafter.

According to the first embodiment of the present invention, in order to form a titanium nitride film, a deposition process and a annealing process are sequentially and alternately carried out, with a semiconductor substrate being held in the same reactor.

(a) Deposition process

The heater 2 for heating a substrate is turned ON and, by heating the semiconductor substrate 4 on the susceptor 3, a temperature of the substrate is held at about 500° C.

The tank heater 11 is turned on and, after the material tank 9 is heated to about 80° C. to evaporate liquid titanium tetrachloride, the flow rate of the evaporated titanium tetrachloride is adjusted to about 20 sccm (standard cubic centimeter per minute) by using a gas mass flow controller 10a and is introduced into the reactor 1 through the gas introduction tube 8a as shown in FIG. 1.

At the same time, the ammonia gas, with its flow rate adjusted to about 100 sccm by using the gas mass flow controller 10b, is introduced into the reactor 1 through the gas introduction tube 8b. Further, the nitrogen gas used as a diluent gas, with its flow rate adjusted to about 500 sccm by using the gas mass flow controller 10, is introduced into the reactor 1 through the gas introduction tube 8c.

By utilizing the turbo-molecular pump and dry pump, the pressure within the reactor 1 is reduced approximately to 1 Torr.

While the state in the reactor 1 is held under the condition described above, titanium tetrachloride is made reactive with ammonia, causing a titanium nitride film to be deposited on the semiconductor substrate 4. In the embodiment, when the film reaches 50 nm in thickness, the deposition is completed.

(b) Annealing process

After the deposition is completed, the semiconductor substrate 4 within the reactor 1 is held at about 500° C. The low pressure mercury lamp 5 is turned on to emit light with a wavelength of 170–280 nm and the inner part of the reactor 1 is irradiated with the ultraviolet rays through the quartz window 6. The ammonia gas, with its flow rate adjusted to about 1000 sccm, is introduced into the reactor 1, with its pressure held at about 10 Torr to anneal the film in an ammonia gas atmosphere for about 60 seconds.

The pressure in the inner part of the reactor 1 is then restored to an atmospheric level and the semiconductor substrate 4 on which a titanium nitride film is grown is brought out of the reactor 1.

In the conventional annealing process, energy required for nitridation has been supplied in the form of heat from the surface of the heated semiconductor substrate 1 and a temperature exceeding 600° C. has been required for annealing. According to the first embodiment of the present invention, since ammonia is excited by ultraviolet rays, part of energy required for nitridation can be obtained from the ultraviolet rays. Accordingly, even if the temperature for annealing is as low as 500° C., the nitridation process is facilitated more smoothly than that in the conventional method.

The degree of nitridation to be achieved at the time of the deposition can be lower than that in the conventional method, thus making possible the deposition at a low temperature of about 500° C.

According to the first embodiment of the present invention, since both the deposition of metal nitride films and the annealing required for facilitating the nitridation process can be carried out at a low temperature, this method for forming titanium nitride films can be applied to the substrate even after aluminum wiring has been provided. This method allows a full acceleration of the degree of nitridation by the aid of ultraviolet rays, even if the annealing is carried out at a low temperature, and a titanium nitride film with low resistance and stability can be obtained accordingly.

Second Embodiment

Figure 2:
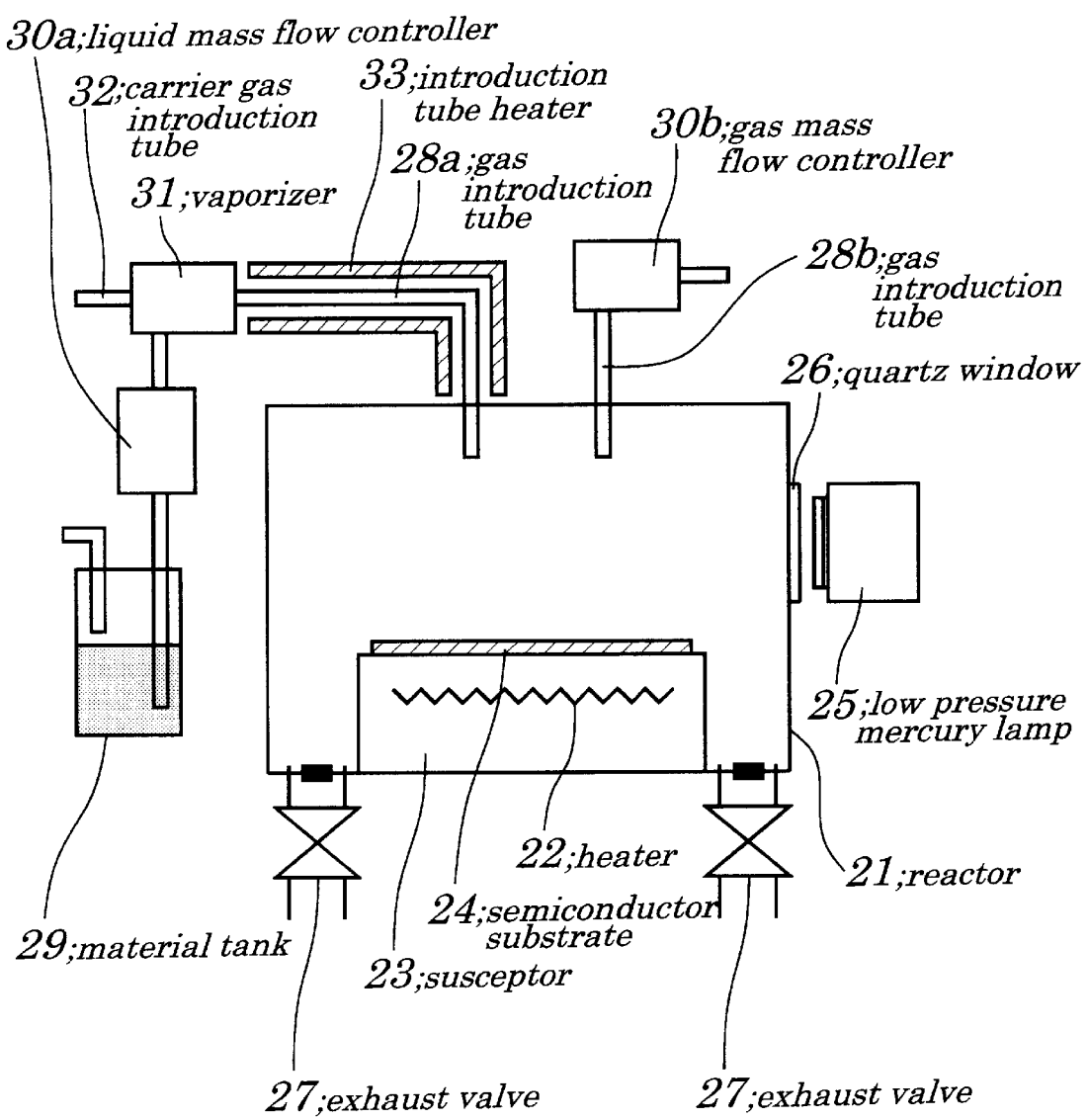
FIG. 2 is a schematic cross section of a reactor to implement a method for forming a titanium nitride film in accordance with the second embodiment of the present invention.

FIG. 2 is a schematic cross section of a CVD reactor to implement a method for forming a titanium nitride film in accordance with a preferred second embodiment of the present invention.

The second embodiment differs from the first embodiment greatly in that the deposition is carried out by MOCVD instead of thermal CVD and that the deposition and annealing are repeated alternately and a plural number of times.

The CVD reactor used in the second embodiment is almost the same, in terms of its structure, as the hot-wall type CVD reactor as shown in FIG. 1. As depicted in FIG. 2, the inner part of the reactor 21 is so constructed that the semiconductor substrate 24 composed of a silicon wafer and the like can be heated, through a susceptor 23, by a heater 22 for heating a substrate by using a radio frequency wave, infrared ray lamp, or resistor. A low pressure mercury lamp 25 emitting ultraviolet rays is fitted to the outside of the reactor 21. The low pressure mercury lamp 25 is so disposed that the inner part of the reactor 21 is irradiated with ultraviolet rays through a quartz window 26 mounted on the top surface of the reactor 21 as shown in FIG. 2.

The inner part of the reactor 21 is held under a reduced pressure by evacuating air from a turbo-molecular pump and dry pump (not shown) through an exhaust valve 27, while tetrakis-dimethylamino-titanium [Ti(N(CH$_3$)$_2$)4] gas as a reactive gas and ammonia (NH$_3$) as a nitridation gas for annealing are introduced into the reactor 21 through gas introduction tubes 28a and 28b respectively.

The tetrakis-dimethylamino-titanium [Ti(N(CH$_3$)$_2$)4] stored in a material tank 29 in a liquid state, with its flow rate adjusted by a liquid mass flow controller 30a and is guided to a vaporizer 31 through a pump (not shown) and is brought into the reactor 21 by a nitrogen gas (as a carrier gas) fed into a vaporizer 31 through a carrier gas introduction tube 32.

Moreover, an introduction tube heater 33 communicating between the vaporizer 31 and the reactor 21 is provided in the area surrounding the gas introduction tube 28a so that the tetrakis-dimethylamino-titanium gas vaporized by the vaporizer 31 is heated by an introduction tube heater 33 to a predetermined temperature for a time when the tetrakis-dimethylamino-titanium gas is guided into the reactor.

The ammonia gas used as a nitridation gas for annealing is stored in an exclusive tank (not shown) and the ammonia gas outputted from the exclusive tank (not shown), with its flow rate adjusted by the gas mass flow controller 30b, is also introduced into the reactor 21 through the gas introduction tube 28b.

By referring to FIG. 2, a method for forming a titanium nitride in this embodiment will be described below.

In this method, a deposition process and an annealing process are carried out alternately and five times, with the semiconductor substrate being held in the same reactor.

(a) Deposition process

As a first step, a heater 22 for heating a substance is turned ON and, by heating a semiconductor substrate 24 on a susceptor so that a temperature of the substrate is held at about 400° C. Then, the liquid tetrakis-dimethylamino-titanium is fed, with a predetermined flow rate adjusted by a liquid mass flow controller 30a, from a material tank 29 to a vaporizer 31 where the liquid is vaporized at a rate of 0.1g/min. The evaporated tetrakis-dimethylamino-titanium, with the help of a nitrogen gas (as a carrier gas) having a flow rate of about 100 sccm fed through a carrier gas introduction tube 32 into a vaporizer 31, is introduced into the reactor 21.

In this state, by driving a turbo molecular pump and dry pump, the pressure within the reactor 1 is reduced to about 1 Torr. While the inner part of the reactor 1 being held in this condition, the tetrakis-dimethylamino-titanium [Ti(N(CH$_3$)$_2$)4] is thermally decomposed, causing the carbon-containing titanium nitride (TiN:C) film to be grown on the semiconductor substrate 24. In this embodiment, when the thickness of the carbon-containing titanium nitride reaches about 10 nm, the first deposition process is completed.

(b) Annealing process

When the first deposition is completed, the semiconductor substrate 24 in the reactor 21 is held to about 400° C. The low pressure mercury lamp 25 is turned on to emit ultraviolet rays and, with the inner part of the reactor 21 irradiated with the ultraviolet rays through a quartz window 26, the ammonia gas is introduced into the reactor 21 the inner part of which is held to about 10 Torr with the flow rate of 1000 sccm and the first time annealing on the film in an ammonia gas atmosphere for about 60 seconds is carried out.

Then, the second deposition is carried out in the same condition as for the first deposition described above. When the thickness of a carbon-containing titanium nitride reaches about 20 nm, the second deposition is completed. After the second deposition is completed, the second annealing in an ammonia gas atmosphere is carried out continuously under almost the same condition as for the first annealing. Such deposition and annealing are repeated alternately and five times. Thus, carbon-containing titanium nitride (TiN:C) film with a thickness of about 50 nm is grown.

After that, the pressure within the reactor 1 is restored to an atmospheric level and the semiconductor substrate 24 on which a carbon-containing titanium nitride film is grown is brought out from the reactor 21.

As described above, in this embodiment, since the nitridation is accelerated by excitation of ammonia by way of irradiation of ultraviolet rays at the time of annealing, the same effect as in embodiment 1 is obtained. In addition, because the plural number of times' deposition and annealing are alternately repeated little by little, carbon is fully eliminated not only from a surface layer but also from a bottom layer of the titanium film, facilitating uniform nitridation through the surface layer to the bottom layer of the film accordingly. This enables a supply of a titanium nitride film with low resistance and stability. Furthermore, this method allows a temperature for the deposition and annealing to be decreased to about 400° C. Also, this method can reduce damage to the semiconductor substrate 24 because there is no application of plasma to the annealing process.

It is thus apparent that the present invention is not limited to the above embodiments but may be changed and modified without departing from the scope and spirit of the invention. For example, conditions for deposition, annealing and the number of repeated times of alternate deposition and annealing may be changed, if necessary. In the above embodiment, ammonia is used as a gas for nitridation, however, nitrogen compounds such as hydrazine ($N_2H_4$) and the like, and a compound such as methyl hydrazine ($CH_3)N_2H_3$) containing a group represented by a chemical formula of $N_mH_n$ (N is a nitrogen atom, H being a hydrogen atom and, m and n being any natural number) including NH, amino-group (—$NH_2$), $NH_4$, $N_2H_3$ and the like may be used. Similarly, a titanium compound is not limited to the substance described in the above embodiment.

Although, in the above embodiment, the method for growing a titanium nitride film and a carbon-containing titanium nitride film is described, this method can be also applied to the formation of a metal nitride film including oxygen-containing titanium nitride (TiN:O) and tantalum nitride (TaN). Furthermore, this method can be applied to the formation of tungusten nitride (WN) film using tungsten hexafluoride ($WF_6$).

Since the method of the present invention can be carried out at a low temperature, not only a semiconductor substrate but also a glass substrate can be used as a substrate to be used in this method. Moreover, a reactor other than the CVD reactor can be used for forming the metal nitride film. Though the excitation is made using ultraviolet rays in this embodiment, any light besides ultraviolet rays can be used so long as it is able to excite the nitrogen compound gas.

Thus, in the conventional annealing process, because all energy required for nitridation has been supplied in the form of the heat from the heated surface of the semiconductor substrate 4, a temperature exceeding 600° C. is required for annealing. According to the embodiment of the present invention, since ammonia is excited by light such as ultraviolet rays at the time of annealing, part of energy required for nitridation can be obtained from light such as ultraviolet rays.

Accordingly, even if the temperature for annealing is as low as 500° C., nitridation of a metal film is facilitated more smoothly than that in the conventional method, enabling supply of a titanium nitride film with low resistance and stability.

The degree of nitridation to be achieved at the time of the deposition can be lower than that in the conventional method, thus making possible the deposition at a low temperature of about 500° C. and enabling the application of this method to the substrate even after aluminum wiring is provided.

Additionally, because the plural number of times' deposition and annealing are alternately repeated little by little, uniform nitridation of a metal film through its surface layer to the bottom layer thereof can be facilitated. It is, therefore, possible to obtain a metal nitride film with low resistance and stability. Further, temperatures required for the deposition and annealing can be decreased to about 400° C. This method can reduce damage to the semiconductor substrate 24 because of no application of plasma to the annealing process.

Finally, the present application claims the priority of Japanese Patent Application No. Hei10-145632 filed on May 27, 1998, which is herein incorporated by reference.

What is claimed is:

1. A method of forming a metal nitride film comprising the steps of:

growing a metal nitride film on a substrate by using chemical vapor deposition; and carrying out heat treatment of said metal nitride film, while it is exposed to light, from a lamp which is insufficient to heat said substrate, in an atmosphere of gas including a compound or group represented by a chemical formula of $N_mH_n$ (N being a nitrogen atom, H being a hydrogen atom and m and n being any natural number), wherein said heat treatment is carried out after said metal nitride film is deposited and grown.

2. The method for forming a metal nitride film according to claim 1, comprising a step of repeating, alternately and a predetermined number of times, a process of growing said metal nitride film on said substrate and a process of thermally treating said metal nitride film while it is exposed to light in said gas atmosphere.

3. The method for forming a metal nitride film according to claim 1, comprising a step of carrying out, in the same reactor, a process of growing said metal nitride film on said substrate and a process of thermally treating said metal nitride film while it is exposed to light in said gas atmosphere.

4. The method for forming a metal nitride film according to claim 1, wherein said metal nitride film formed on said substrate comprises at least one member selected from said group consisting of titanium nitride, carbon-containing titanium nitride, oxygen-containing titanium nitride, tantalum nitride and tungsten nitride.

5. The method for forming a metal nitride film according to any one of claims 1–4 wherein said light is an ultraviolet ray.

6. The method for forming a metal nitride film according to claim 1, wherein said compound or group represented by said chemical formula of $N_mH_n$ comprises at least one member selected from the group consisting of $NH_3$ and NH, $NH_2$, $NH_4$, and $N_2H_3$ and $N_2H_4$.

7. The method for forming a metal nitride film according to claim 6, comprising a step of repeating, alternately and a predetermined number of times, a process of growing said metal nitride film on said substrate and a process of thermally treating said metal nitride film while it is exposed to light in said gas atmosphere.

8. The method for forming a metal nitride film according to claim 6, comprising a step of carrying out, in the same reactor, a process of growing said metal nitride film on said substrate and a process of thermally treating said metal nitride film while it is exposed to light in said gas atmosphere.

9. The method for forming a metal nitride film according to claim 6, wherein said metal nitride film formed on said substrate comprises at least one member selected from said group consisting of titanium nitride, carbon-containing titanium nitride, oxygen-containing titanium nitride, tantalum nitride and tungsten nitride.

10. The method for forming a metal nitride film according to any one of claims 6–9 wherein said light is an ultraviolet ray.

* * * * *